United States Patent [19]

Di Milia et al.

[11] Patent Number: 4,551,192

[45] Date of Patent: Nov. 5, 1985

[54] ELECTROSTATIC OR VACUUM PINCHUCK FORMED WITH MICROCIRCUIT LITHOGRAPHY

[75] Inventors: Vincent Di Milia, Pleasantville; Juan R. Maldonado, Chappaqua; James L. Speidell, Carmel, all of N.Y.; John M. Warlaumont, Ridgewood, N.J.

[73] Assignee: International Business Machines Corporation, Armonk, N.Y.

[21] Appl. No.: 509,738

[22] Filed: Jun. 30, 1983

[51] Int. Cl.$^4$ .................. H01L 21/306; B44C 1/22; C03C 15/00; C03C 25/06

[52] U.S. Cl. .................. 156/345; 118/731; 156/645; 156/646; 156/647; 156/653; 156/649; 156/657; 156/659.1; 156/662; 269/21; 269/54.5; 269/902; 430/313; 430/317

[58] Field of Search .............. 156/643, 644, 645, 646, 156/647, 653, 649, 657, 659.1, 662, 345; 269/21, 53, 54.5, 902, 903, 909; 118/731; 430/313, 317

[56] References Cited

U.S. PATENT DOCUMENTS

| | | | |
|---|---|---|---|
| 4,004,955 | 1/1977 | Dost et al. | 156/649 |
| 4,313,783 | 2/1982 | Davies et al. | 156/345 |
| 4,339,297 | 7/1982 | Aigo | 156/345 |
| 4,439,261 | 3/1984 | Pavone et al. | 156/345 |

Primary Examiner—William A. Powell
Attorney, Agent, or Firm—Ronald L. Drumheller

[57] ABSTRACT

A pinchuck is formed in accordance with this invention by using lithographic techniques to define and to etch a pattern of pins from an extremely flat etchable surface. Since the pins are formed from a surface which is already flat, it is not necessary to level or polish the pins after they are formed. Since lithographic techniques are used, the pin head dimensions, the number of pins, the arrangement of pins, and the density of pins all may be freely chosen without affecting the fabrication cost. By surrounding the region of etched pins with an unetched band, a raised peripheral ring will be formed which can act as a vacuum sealing ring when the pinchuck is used as a vacuum pinchuck. By fabricating the pins from an electrically conductive material (such as doped silicon) and then covering the pins with a dielectric film (such as silicon dioxide), the pinchuck can be used as an electrostatic pinchuck. By doing both, the same pinchuck can be used as an electrostatic pinchuck or as a vacuum pinchuck or as both simultaneously.

30 Claims, 11 Drawing Figures

FIG. 1.1
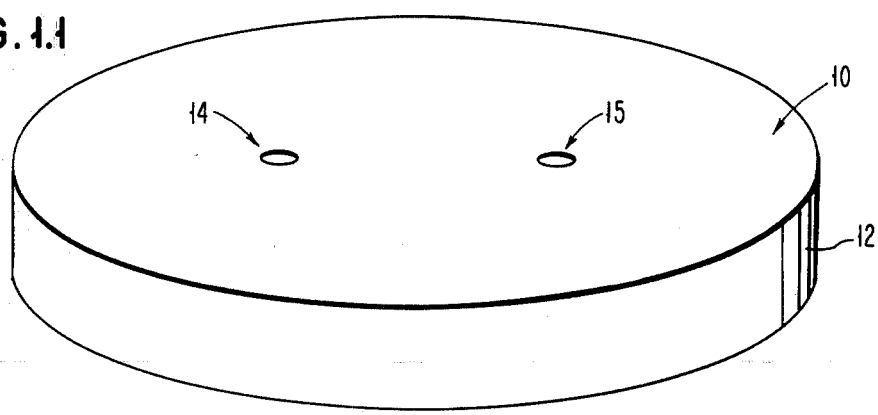
FIG. 1.2
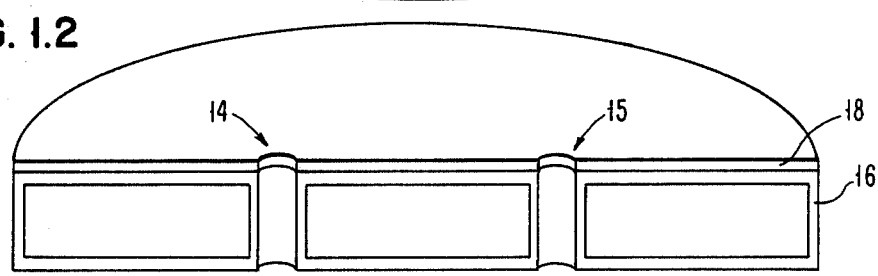
FIG. 1.3
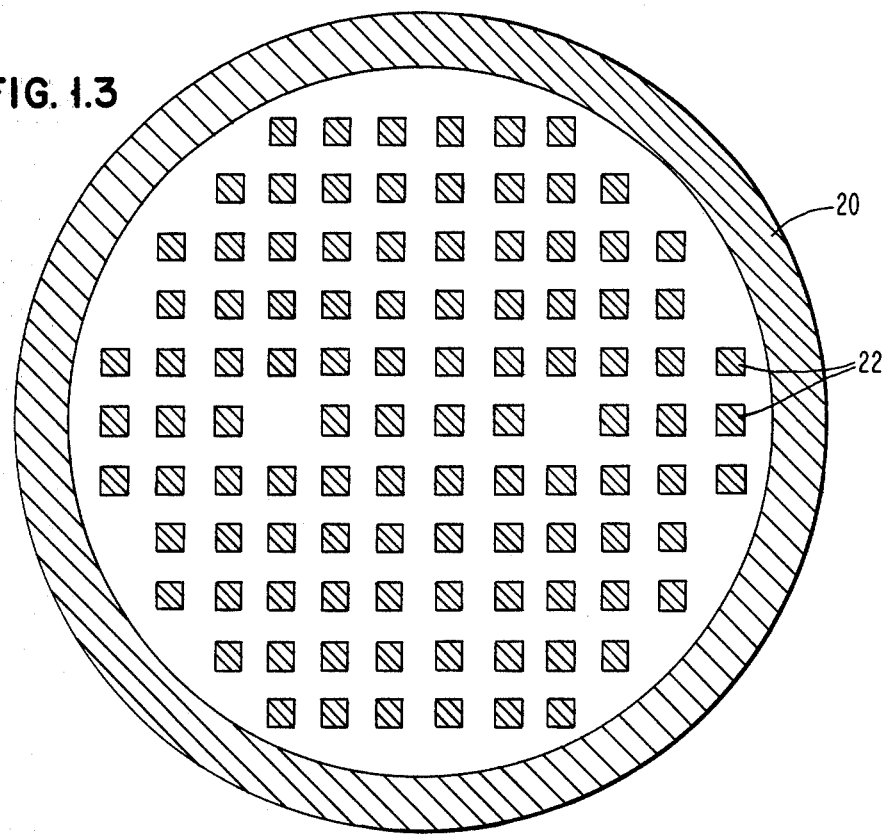

FIG. 1.4
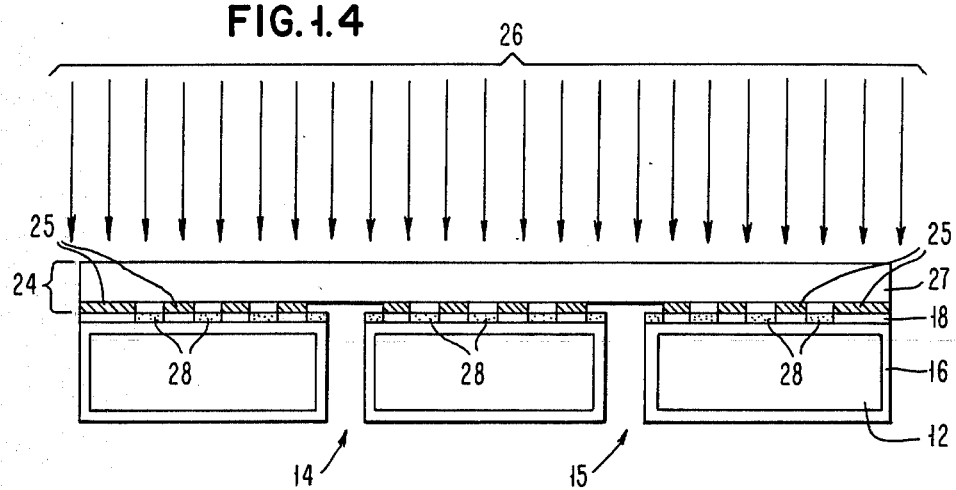
FIG. 1.5
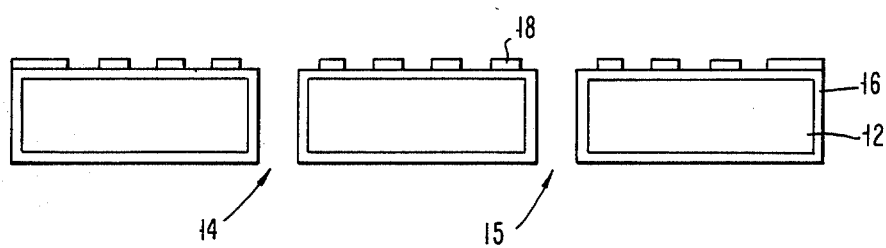
FIG. 1.6
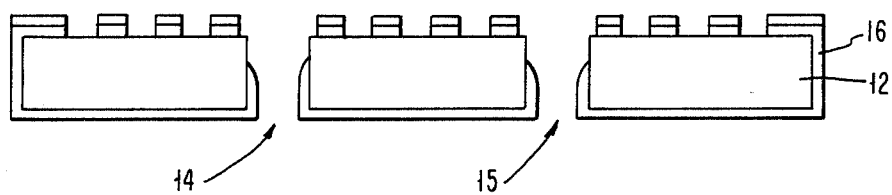

FIG. 1.7
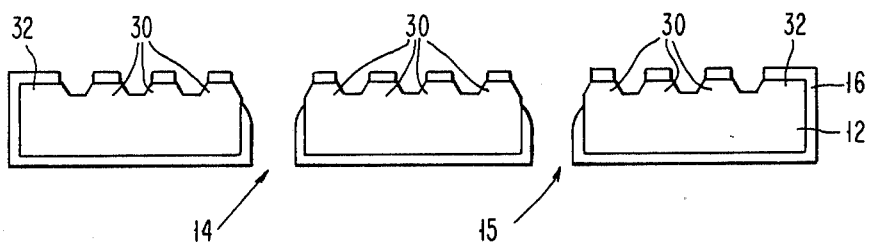
FIG. 1.8
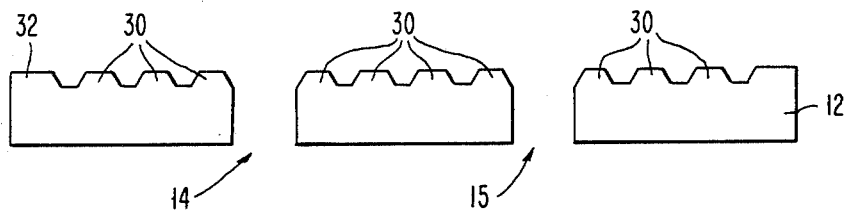
FIG. 1.9
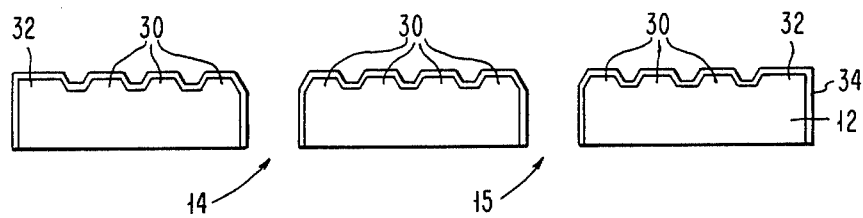

ELECTROSTATIC OR VACUUM PINCHUCK FORMED WITH MICROCIRCUIT LITHOGRAPHY

DESCRIPTION

1. Technical Field

This invention generally relates to chucks for holding integrated circuits and other electronic components and devices during fabrication thereof, and more particularly it relates to pinchucks, which also control the flatness of a supported substrate, such as a semiconductor wafer.

2. Background Art

During the manufacture of integrated circuits and other electronic components and devices, chucks are used to conveniently hold and locate supporting substrates during fabrication of overlying structures. Chucks are also used to simultaneously keep substrates (particularly semiconductor wafers) at the same flatness during successive alignment and lithographic patterning steps. In order to achieve an accurate overlay of successive lithographic patterns, the substrate should be held flat during alignment operations. During lithographic pattern exposures, whether they be with electron beam, ion beam or light (visible, ultra-violet or X-ray), flatness of the substrate must be maintained to satisfy depth of focus limitations, to control penumbral blurring, and to reduce run out error.

One way of maintaining the same substrate curvature during successive processing steps is to support the substrate with a vacuum pinchuck (or "bed of nails"). A vacuum is drawn and maintained under the substrate where the pins are so that when the other side of the substrate is brought to atmospheric pressure, the substrate is drawn against the pins making point contact with each pin. If the pin tips are all in a flat plane, the substrate is held flat also. The advantage a pinchuck has over the conventional flat surface vacuum chuck is that it minimizes the possibility of dust particles changing the substrate curvature each time the substrate is remounted on the chuck.

The main disadvantage of the vacuum pinchuck is that it is difficult and expensive to manufacture, particularly for one sufficiently large to hold a 125 millimeter silicon wafer. In the conventional method of construction, each minute pin is fabricated separately and each pin is then set into a previously drilled hole in a flat metallic block having a raised rim machined around the periphery. The machined rim is used for vacuum sealing purposes. After the pins have been mounted on the block, the pinned surface of the block is carefully polished to very exacting tolerances in order to assure that all of the pin tips and the outside sealing ring are all perfectly flat and are all aligned with each other in exactly in the same plane. Obviously this is a very tedious and a very costly operation.

It is an object of this invention to provide a pinchuck which is inexpensive to fabricate.

Another object is to provide a pinchuck which has the same thermal expansion coefficient as the substrate supported thereby.

Still another object of this invention is to increase the density (number) of pins in a pinchuck without increasing the cost of fabrication.

It is also an object to reduce the diameter of the pins of a pinchuck without increasing the cost of fabrication.

Another object of this invention is to provide a pinchuck which can be used in a vacuum environment, unlike vacuum pinchucks.

Still another object is to provide an electrostatic pinchuck.

DISCLOSURE OF THE INVENTION

A pinchuck is formed in accordance with this invention by using lithographic techniques to define and to etch a pattern of pins from an extremely flat surface. A block of suitable material is polished to form such an extremely flat surface. The desired pin pattern (preferably along with a vacuum sealing ring surrounding the pins) is defined with a mask, which is then used to etch the flat surface so as to form an array of pins (and optional sealing ring). Since the pins (and the optional vacuum sealing ring) are formed from a surface which is already flat, it is not necessary to polish the pins after they are formed. The top surfaces of the pins (and the top surface of the optional vacuum sealing ring) already lie within a common plane. Since lithographic techniques are used, the pin head dimensions, the number of pins, the arrangement of pins, and the density of pins all may be freely chosen without affecting the fabrication cost.

Preferably the pinchuck is formed from a block of doped silicon, not only because silicon has suitable properties and lithographic fabrication processes for silicon are well known and understood, but also because a silicon pinchuck will have a thermal expansion coefficient which matches the thermal expansion coefficient of a silicon wafer. By surrounding the region of etched pins with an unetched band, a raised periphery ring will be formed which will act as a vacuum sealing ring when the pinchuck is used as a vacuum pinchuck. By fabricating the pins from an electrically conductive material (such as doped silicon) and then covering the pins with a dielectric film (such as silicon dioxide), the pinchuck can be used as an electrostatic pinchuck. If a vacuum sealing ring is formed and the pins (and ring) are covered with a dielectric film, the same pinchuck can be used as an electrostatic pinchuck or as a vacuum pinchuck or both.

BRIEF DESCRIPTION OF THE DRAWINGS

FIGS. 1.1–1.9 step-by-step illustrate the fabrication of a pinchuck in accordance with this invention.

DESCRIPTION OF THE PREFERRED EMBODIMENT

Figure 2:
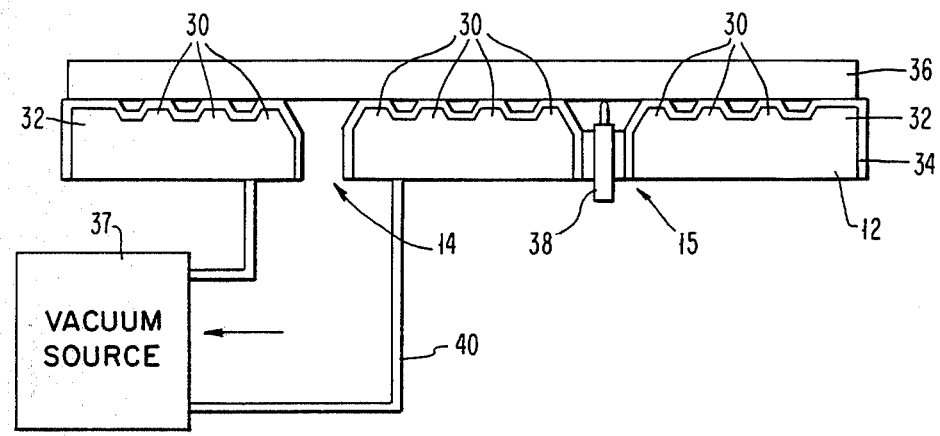
FIG. 2 shows a pinchuck constructed in accordance with this invention in use as a vacuum pinchuck.

Referring now to the drawings, FIGS. 1.1–1.9 illustrate step-by-step the fabrication of a preferred pinchuck in accordance with this invention.

A nominally flat surface 10 is formed on a block 12 of suitable material. It is preferred that the block 12 be composed of silicon because formation of small physical structures in silicon by means of lithography and etching is a very well understood process in the microcircuit industry and because the substrate expected to be held flat by the resulting pinchuck is a silicon wafer. It is advantageous to have the same thermal coefficient of expansion for both the pinchuck and the substrate it supports since some processing steps result in temperature changes. It should be understood that the pinchuck could be fabricated in principle from any desired etchable material, including most ceramic and refractory materials (e.g., SiC, SiN, WC, ZrN, etc.) and some metals (e.g., aluminum or steel).

The geometry of the finished pinchuck preferably should match the geometry of the substrate to be supported thereby, particularly if the finished pinchuck is to be used as a vacuum pinchuck. Since it is expected that the finished pinchuck will be used to handle round silicon wafers, it has been assumed that the block 12 is cylindrical as shown. The height or thickness of cylindrical block 12 should be sufficient that the finished pinchuck remains rigid under electrostatic and/or vacuum operation. It is convenient to form the block 12 by cutting a thick slice of silicon from the same kind of boule from which thin slices are cut to form silicon wafers to be processed.

Two holes 14 and 15 are formed (i.e., by drilling) in the cylindrical block 12. One of these holes acts as an aperture through which a suitable vacuum can be drawn when the finished pinchuck is used as a vacuum pinchuck. The other hole receives a pogo contact, which is used for applying an electrical potential to the supported substrate when the finished pinchuck is used as an electrostatic pinchuck. Obviously, if the finished pinchuck is to be used exclusively as an electrostatic pinchuck or exclusively as a vacuum pinchuck, then the hole associated with the mode of operation which will not be used need not be provided. Also, other ways of providing electrical contact to the supported substrate may be used which do not require a hole.

The nominally flat surface 10 is next polished until surface 10 is extremely flat. The degree of flatness achieved at this step controls the degree of flatness of the finished pinchuck. Preferably the surface should be flat to within a small fraction of a micron and the surface finish preferably should be of high optical quality.

An etching mask is now formed on top of the polished surface. There are many ways in which this may be done. The etching mask structure and the method used to form the etching mask depend in large part upon the composition and crystallography of the polished block and the etching process selected. In order to obtain pins of suitable height, density and aspect ratio, a directional etching process may be used, such as plasma etching (for example, reactive ion etching). In such case, an etching mask should be formed which will withstand the plasma etching sufficiently well.

Plasma etching can be avoided by selecting a material which can be anisotropically etched. Single crystal silicon can be anisotropically etched and is preferred. For anisotropic etching, a single crystal silicon block is oriented such that the [100] face corresponds with the polished surface. If polycrystalline silicon is used instead of monocrystalline silicon, a plasma etching technique might be used instead.

The preferred etching mask is fabricated from $SiO_2$. $SiO_2$ is preferred over directly using a conventional resist as the etching mask because $SiO_2$ withstands both anisotropic etchants and plasma etchants with much less thickness loss. Since formation of the pins requires a rather deep etch by conventional standards, use of a conventional resist directly would require an unusually thick resist layer. It is considered more preferable to use a standard thickness resist pattern to fabricate a mask from a material which better withstands the etchant selected.

The first step in forming the preferred $SiO_2$ mask is to oxidize the surface of the polished silicon block to form a layer 16 of $SiO_2$. This can be done by merely heating the silicon block in the presence of oxygen. An $SiO_2$ layer of about one micron is suitable. Although the $SiO_2$ layer could be confined to the polished surface, it is not disadvantageous to oxidize the entire exposed surface of the block as shown in FIG. 1.2.

Next, a patternable resist layer 18 is deposited over the $SiO_2$ layer (FIG. 1.2). Virtually any kind of positive or negative patternable resist can be used in principle. However, as will be seen, the nature of the pattern to be formed and the resolution desired makes it advantageous to use a standard positive photoresist, such as AZ 1350 sold by the Shipley Co.

The resist layer 18 is exposed to patterned actinic radiation. A plan view of a suitable exposure pattern is shown in FIG. 1.3. The shaded parts correspond to the regions which will be raised in the finished pinchuck and which will form a flat supporting plane for the substrate. Shaded parts 22 correspond with the top surface areas of the pins and shaded area 20 corresponds to the vacuum sealing periphery ring. If a positive photoresist is used (as will be assumed hereinafter), then the exposure pattern corresponds to the unshaded areas in FIG. 1.3. If a negative rather than a positive resist is used, the exposure pattern would correspond instead to the shaded areas in FIG. 1.3.

It should be apparent that a computer controlled writing beam of any suitable radiation type could be used to make the pattern exposure. Preferably the pattern exposure is made with a mask in combination with a flood beam of suitable radiation. This can be done not only with contact printing lithography but also with projection lithography or proximity printing techniques. FIG. 1.4 illustrates the preferred method of making the pattern exposure. A contact lithography mask 24 is formed and positioned as shown and then exposed to flood illumination 26. The exposed regions of the underlying resist layer are labelled 28. Mask 24 comprises an opaque pattern 25 on a transparent support 27.

Upon development (FIG. 1.5), positive resist layer 18 forms the negative or complement of the exposure pattern, i.e., it corresponds with the regions which will not be raised in the finished pinchuck. A negative resist with a complementary exposure pattern would produce the same resist pattern.

The patterned resist layer 18 is now used as an etch mask to form a similar pattern in the underlying $SiO_2$ layer (FIG. 1.6). A suitable etchant for this purpose is commercially available Buffered Oxide Etchant (BOE), which is ammonium fluoride and hydrofluoric acid in a 9:1 ratio. While the resist mask could be deliberately removed after the pattern is transferred into the $SiO_2$ layer, there is often no disadvantage in leaving it in place, since the resist might dissolve away anyway during the final etching step, as illustrated in FIG. 1.7.

The pins are now formed by applying a suitable etchant. A solution of ethylene-diamine, pyrocatecol, and water is a suitable anisotropic etchant for monocrystalline silicon. Potassium hydroxide could also be used. Pyramidal pin structures 30 result from using an anisotropic etchant, as shown in FIG. 1.7. A vacuum sealing ring 32 surrounds the pyramidal pin structures. A plasma etchant would produce more vertical pin walls, which may or may not be desired depending upon the strength of the pin material and the dimensions involved.

The depth of the pin producing etch should be sufficient to allow a uniform vacuum to be produced under a substrate supported by the completed pinchuck. An etch depth of about 250 to 400 microns is preferred. The diameter of the pins at the top may range from about 25 microns (0.025 mm) to about 5,000 microns (5 mm). If the diameter of the top surface of the pins is too small, the pins tend to damage the supported substrate. On the other hand, if the diameter of the top surface of the pins is too large, a dust particle can be trapped between a pin and the supported substrate. For supporting silicon wafers with a silicon pinchuck, a pin width at the top of about 1000 microns (1 mm) seem to be a good compromise and is preferred. The four-sided pyramidal pin structures produced by an anisotropic etchant are preferred for a silicon pinchuck because they are believed to be more durable in use. Since a regular four-sided pyramid truncated parallel to the base has a square top, square geometry is preferred for the pin top surfaces. Since the force applied by the pinchuck to the supported substrate during the electrostatic mode of operation is proportional to the total raised area of the pinchuck in contact with the supported substrate, it is preferred that the contact area of the pins be as great as practical. A suitable spacing for square pins having 1 millimeter sides (at the top) is about 2 millimeters center-to center. This corresponds to more than 3,000 pins in the area covered by a standard 125 millimeter silicon wafer. A pinchuck with 3,000 pins is not very practical to fabricate by conventional pinchuck fabrication techniques.

After the pins have been formed, the $SiO_2$ etching mask may or may not be removed (FIG. 1.8). The pinchuck could be used in this form as a vacuum pinchuck, with or without the $SiO_2$ mask still in place. In order to use the pinchuck as an electrostatic pinchuck, an insulating film must cover at least the surfaces of the pinchuck which will come in contact with the supported substrate. Also, one area of the pinchuck (such as the bottom) must be uninsulated so that electrical contact may be made to the pinchuck. For a silicon pinchuck, preferably the insulator is $SiO_2$. While it may be possible under suitable circumstances to use the original $SiO_2$ mask as the desired insulator layer (or as a starting layer upon which to build), this is not preferred because it does not tend to result in a uniform and flat $SiO_2$ layer. It is preferred that the $SiO_2$ mask be removed and a new $SiO_2$ layer be formed by merely heating the pinchuck in the presence of oxygen until an $SiO_2$ layer of suitable thickness is formed, such as 2 microns. The $SiO_2$ is then removed from the bottom so that electrical contact can be made there (FIG. 1.9).

FIG. 2 shows the completed pinchuck in use as a vacuum pinchuck supporting a silicon wafer 36. Air is drawn away from the underside of wafer 36 by vacuum source 37 through vacuum line 40 and hole 14 to produce a lower pressure on the pinside of the wafer than on the other sides of the wafer. Hole 15 receives an air tight plug, such as a pogo contact 38 as illustrated. The higher pressure above the wafer 36 pushes the wafer down into uniform contact with the thin insulator film covering pins 30 and ring 32. Since the ring 32 and pins 30 are all in the same plane, wafer 36 is flattened and held thereby as desired.

Figure 3:
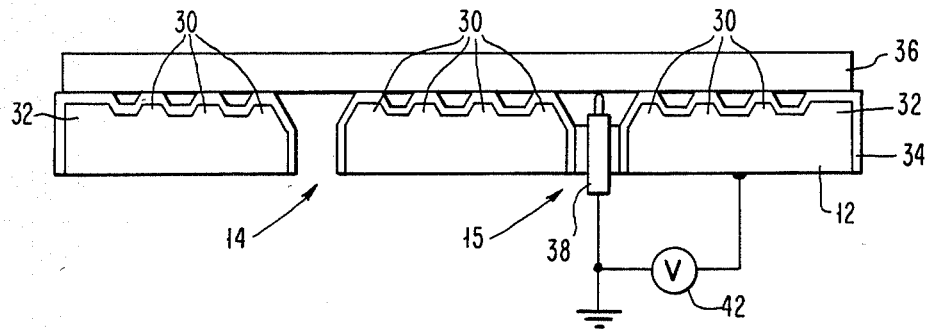
FIG. 3 shows the FIG. 2 pinchuck in use as an electrostatic pinchuck.

FIG. 3 shows the same pinchuck in use as an electrostatic pinchuck supporting the silicon wafer 36. An electrical potential is applied between the pinchuck body 12 and the wafer 36 by source 42 via a pogo contact 38. Pogo contact 38 has been press fitted into an insulating collar 40 seated within hole 15. The electrostatic force generated by the voltage potential between the pinchuck and the wafer tends to pull the wafer into uniform contact with the pins and ring, thereby flattening and holding the wafer as desired. Although source 42 ordinarily should be a D.C. voltage source, it could be an A.C. source instead. An A.C. source might be used, for example, when the electrostatic holding force is desired for a time period sufficiently long that appreciable charge leakage occurs.

A particularly convenient method of using this combination vacuum and electrostatic pinchuck is to first use the vacuum mode of operation to flatten a silicon wafer being held and then to use the electrostatic mode of operation to hold the silicon wafer in the flattened position. This allows the pinchuck and the wafer it holds to be removed from the vacuum source while maintaining the flatness of the wafer. If the voltage source is a D.C. source, it is possible to completely remove the voltage source from the pinchuck and the electrostatic force will remain (at least for a short period of time). The electrostatic force gradually reduces as the charge leaks away. However, a useful electrostatic force can be expected to remain for a period of at least several minutes and may be made to last several hours or days, depending upon the pinchuck dielectric material and thickness, humidity, etc. The electrostatic mode of operation is particularly convenient to use during processing steps which require that the supported wafer be placed in a vacuum system, since a vacuum pinchuck is ineffective in a vacuum environment.

Having thus described our invention, what we claim as new, and desire to secure by Letters Patent is:

1. In a pinchuck of the type wherein pins extend from and are supported by a base, said pins having flat top surfaces all lying in a common plane, the improvement wherein said base and pins are of unitary construction formed by etching from a single block of material having a flat surface.

2. The improvement of claim 1 wherein said pins are coated with dielectric material.

3. The improvement of claim 1 wherein said unitary construction includes a ring also formed by etching from said single block of material, said ring surrounding said pins and extending from said base to a flat top surface thereof, said flat top surface of said ring also lying in said common plane.

4. The improvement of claim 1 wherein the material of said block is semiconductor material.

5. The improvement of claim 4 wherein the material of said block is doped silicon.

6. The improvement of claim 5 wherein the material of said block is monocrystalline doped silicon.

7. The improvement of claim 5 wherein said pins are coated with a silicon dioxide film.

8. A method of forming a pinchuck, comprising the steps of:

forming a flat surface on a block of etchable material; and etching said flat surface so as to form an array of pins, whereby the resulting etched pins extend from and are supported by a resulting base, each etched pin having a flat top surface corresponding with said flat surface of said block of etchable material, all of said flat top surfaces of said pins thereby lying in a common flat plane.

9. A method as defined in claim 8 wherein said etching also forms a ring surrounding said pins, and whereby the resulting etched ring also extends from said base and has a flat top surface corresponding with said flat surface of said block of etchable material, said flat top surface of said ring thereby also lying in said common flat plane.

10. A method as defined in claim 8 wherein the material of said block is a semiconductor material.

11. A method as defined in claim 10 wherein said semiconductor material is doped silicon.

12. A method as defined in claim 11 wherein said semiconductor material is monocrystalline doped silicon.

13. A method as defined in claim 12 wherein said etching is done with an anisotropic etchant.

14. A method as defined in claim 8 and further comprising the step of covering the surface of said pins with a dielectric material, thereby forming an electrostatic pinchuck.

15. A method as defined in claim 14 wherein said dielectric material is a native oxide of the material comprising said block and is formed by oxidizing the surface of said pins.

16. A method as defined in claim 15 wherein the material of said block is doped silicon and said native oxide is silicon dioxide.

17. A pinchuck for holding an electrically conductive object having a nominally flat surface, comprising:
   an electrically conductive base;
   an array of electrically conductive pins in electrical contact with said base and extending substantially perpendicularly from said base, said pins each having a flat top surface lying in a common flat plane;
   a dielectric coating covering at least the top surface of said pins; and
   means for applying a voltage potential between said base and an electrically conductive object lying in contact with the dielectric coating on the top surface of said pins,
   whereby said object may be held against said pinchuck by electrostatic force.

18. A pinchuck as defined in claim 17 wherein the pin density is on the order of 25 pins per square centimeter.

19. A pinchuck as defined in claim 17 wherein the flat top surface area of each of said pins is on the order of one square millimeter.

20. A pinchuck as defined in claim 17 wherein the distance between adjacent pin top surfaces is on the order of one millimeter.

21. A pinchuck as defined in claim 17 wherein said means for applying a voltage potential comprises a pogo contact extending through a hole in said base.

22. A pinchuck as defined in claim 17 wherein said conductive base and conductive pins have a unitary construction formed by etching from a single block of material.

23. A pinchuck as defined in claim 17 wherein said dielectric coating is a native oxide coating.

24. A pinchuck as defined in claim 17 wherein the electrically conductive material of said base and said pins is doped silicon.

25. A pinchuck as defined in claim 24 wherein said silicon is monocrystalline doped silicon and said dielectric coating is silicon dioxide.

26. A pinchuck as defined in claim 17 and further comprising:
   an electrically conductive vacuum sealing ring sealed to and in electrical contact with said base,
   said ring surrounding said pins and extending from said base to a flat top surface thereof, said flat top surface of said ring also lying in said common plane and being covered with said dielectric coating; and
   a hole through said base for withdrawing air from the region between said pins to form a relative vacuum within said region,
   whereby an object covering said flat top surface of said sealing ring may be held against said pinchuck by vacuum induced forces.

27. A pinchuck as defined in claim 26 wherein said conductive base, pins and ring have a unitary construction formed by etching from a single block of material.

28. A pinchuck as defined in claim 26 wherein said dielectric coating on said pins and on said ring is a native oxide coating.

29. A pinchuck as defined in claim 26 wherein the electrically conductive material of said base, pins and ring is a semiconductor material.

30. A pinchuck as defined in claim 26 wherein said semiconductor material is doped silicon and said dielectric coating is silicon dioxide.

* * * * *